(12) United States Patent
Burrows et al.

(10) Patent No.: US 10,995,419 B2
(45) Date of Patent: May 4, 2021

(54) METHODS AND APPARATUS FOR GALLIUM NITRIDE DEPOSITION

(71) Applicant: Applied Materials, Inc., Santa Clara, CA (US)

(72) Inventors: Brian H. Burrows, San Jose, CA (US); Ala Moradian, Sunnyvale, CA (US); Kartik Shah, Saratoga, CA (US); Shu-Kwan Lau, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 40 days.

(21) Appl. No.: 16/427,812

(22) Filed: May 31, 2019

(65) Prior Publication Data

US 2020/0332437 A1    Oct. 22, 2020

Related U.S. Application Data

(60) Provisional application No. 62/834,630, filed on Apr. 16, 2019.

(51) Int. Cl.
| | |
|---|---|
| *C30B 25/02* | (2006.01) |
| *C30B 25/14* | (2006.01) |
| *H01L 21/02* | (2006.01) |
| *C23C 16/455* | (2006.01) |
| *C23C 16/30* | (2006.01) |
| *C30B 29/40* | (2006.01) |

(52) U.S. Cl.
CPC ............ *C30B 25/14* (2013.01); *C23C 16/303* (2013.01); *C23C 16/455* (2013.01); *C30B 29/406* (2013.01); *H01L 21/0254* (2013.01); *H01L 21/0262* (2013.01); *H01L 21/02381* (2013.01)

(58) Field of Classification Search
CPC ................................. C30B 25/02; C30B 25/14
See application file for complete search history.

(56) References Cited

U.S. PATENT DOCUMENTS

| | | | | |
|---|---|---|---|---|
| 10,119,192 | B2* | 11/2018 | Aboagye | C23C 16/45504 |
| 2005/0063448 | A1* | 3/2005 | Kusuda | H01L 21/67115 374/1 |
| 2016/0013274 | A1* | 1/2016 | Dube | H01L 21/02579 438/492 |
| 2018/0033652 | A1* | 2/2018 | Samir | C23C 16/4401 |
| 2018/0095480 | A1* | 4/2018 | Bauer | G05D 11/13 |

\* cited by examiner

*Primary Examiner* — Robert M Kunemund
(74) *Attorney, Agent, or Firm* — Patterson + Sheridan, LLP

(57) ABSTRACT

Embodiment disclosed herein include a liner assembly, comprising an injector plate liner, a gas injector liner coupled to the injector plate liner, an upper process gas liner coupled to the gas injector liner, a lower process gas liner coupled to the upper process gas liner, and an injector plate positioned between the injector plate liner and the upper process gas liner, wherein a cooling fluid channel is formed in the injector plate adjacent to the gas injector liner.

20 Claims, 11 Drawing Sheets

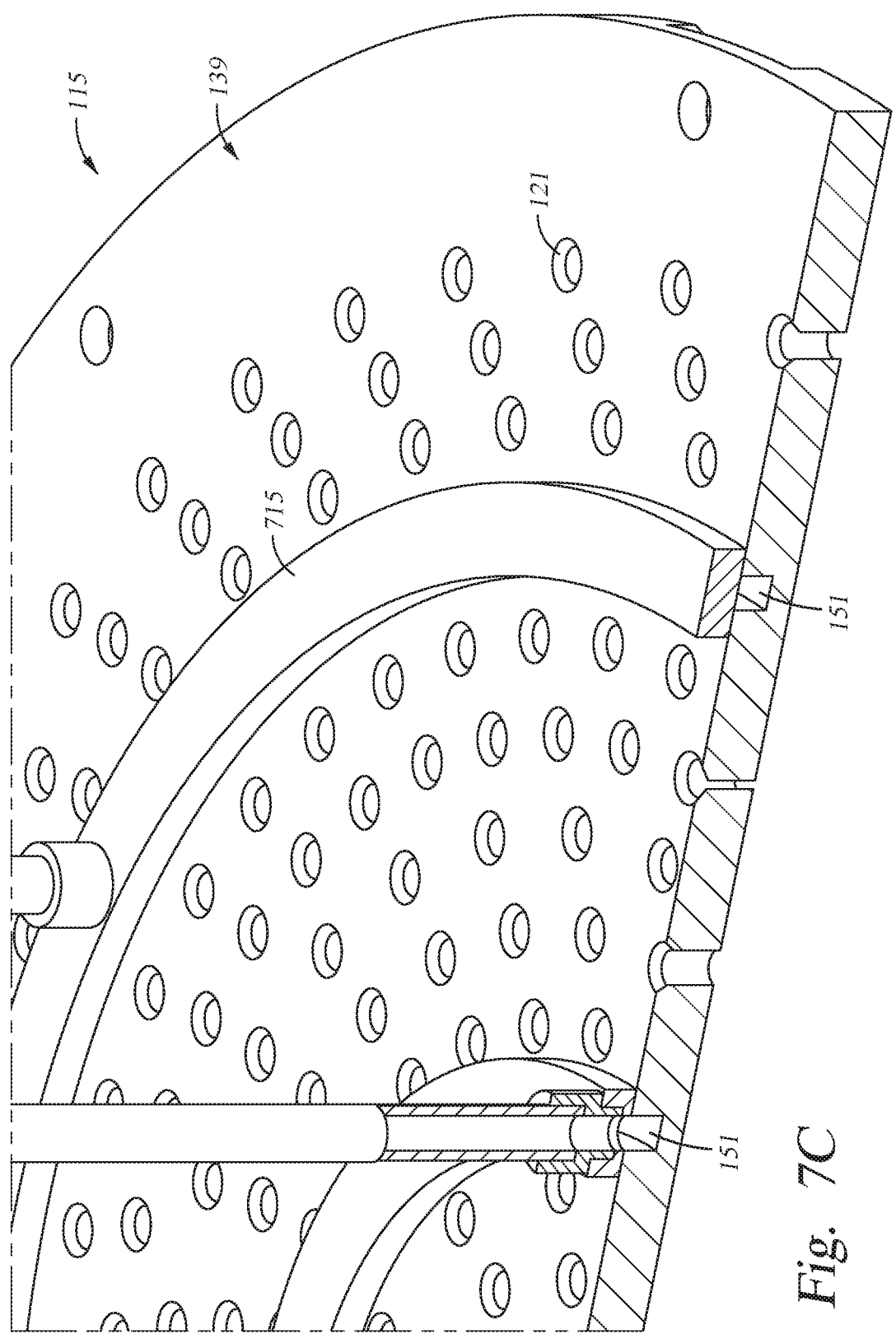

METHODS AND APPARATUS FOR GALLIUM NITRIDE DEPOSITION

CROSS-REFERENCE TO RELATED APPLICATION

This application claims priority to U.S. Provisional Patent Application Ser. No. 62/834,630, filed Apr. 16, 2019, which is incorporated by reference herein.

BACKGROUND

Description of the Related Art

Gallium nitride (GaN) and other III-V materials grown or deposited on a surface of a substrate that has a different lattice constant, such as a silicon (Si), can lead to significant substrate/substrate bow. Substrate bow will also increase as substrates having larger dimensions are used to form the next generation III-V devices. The lattice mismatch between III-V materials (e.g., GaN) and its supporting substrate surface will also result in crystallographic defects and mechanical strain in the formed III-V layer formed on the substrate surface. Defects formed at the interface of a Si substrate's surface and a deposited GaN layer is also commonly created due to the large difference (around 46%) in thermal expansion coefficients between Si and GaN. When GaN is deposited at an elevated temperature (greater than 400° C.) and then cooled (about 23° C.), the substrate bows very noticeably leaving the GaN in massive tensile strain. The substrate generally can have an irregular bowl shape with a bow in a range of about 50 μm to about 150 μm for a 200 mm substrate/substrate and a bow in a range of about 50 μm to about 300 μm for a 300 mm substrate/substrate. Indeed substrate breakage due to the thermo-mechanical forces can occur.

Conventional chambers utilized to deposit GaN have some drawbacks. One includes the decomposition of GaN precursors prior to reaching the substrate. Typically, the GaN precursors will decompose along a flow path to the chamber and/or through the chamber prior to reaching the substrate. This premature decomposition results in clogging of the flow path as well as errant depositions on portions of the chamber. Additionally, hot surfaces within the chamber leads to errant deposition on these components. For example, quartz components configured to be transparent to thermal energy in the form of light and/or transparent to optical sensors are heated to the point that precursors tend to deposit thereon. The errant deposition on these surfaces minimizes the transparency thereof which negatively affects subsequent processes and/or sensor operation. Continued deposition on these surfaces not only blocks optical energy from passing therethrough but may also lead to stress and/or CTE induced delamination of the deposited film, which can generate particles in the processing region of the process chamber.

SUMMARY

Embodiments discussed and described herein provide methods and systems for depositing III-V materials, such as gallium nitride (GaN) on a surface of a substrate.

In one embodiment, a liner assembly is disclosed that includes an injector plate liner, a gas injector liner coupled to the injector plate liner, an upper process gas liner coupled to the gas injector liner, a lower process gas liner coupled to the upper process gas liner, and an injector plate positioned between the injector plate liner and the upper process gas liner, wherein a cooling fluid channel is formed in the injector plate adjacent to the gas injector liner.

In another embodiment, a process chamber is disclosed. The process chamber includes an optically transparent divider and an optically transparent plate positioned opposite the optically transparent divider, and a liner assembly, the liner assembly. The liner assembly includes an injector plate liner, a gas injector liner coupled to the injector plate liner, an upper process gas liner coupled to the gas injector liner, a lower process gas liner coupled to the upper process gas liner, and an injector plate positioned between the injector plate liner and the upper process gas liner, wherein a cooling fluid channel is formed in the injector plate adjacent to the gas injector liner.

In another embodiment, a method of forming a film on a substrate is disclosed. The method includes flowing a precursor gas through a liner assembly comprising an injector plate liner surrounding a substrate, cooling the precursor gas prior to the gas exiting the injector plate liner to a temperature of about 350 degrees Celsius, flowing a processing gas through the liner assembly and toward the substrate at a position below a flow path of the precursor gas while preventing mixing of the processing gas with the precursor gas while the gases are in the liner assembly, and heating the precursor gas to a temperature of about 400 degrees Celsius to about 1,200 degrees Celsius above the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 7A-7C are various views of one embodiment of the reflector plate that may be used with the chamber of FIG. 1

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments discussed and described herein provide methods and systems for depositing III-V materials, such as gallium nitride (GaN) on a surface of a substrate. Unlike substrates containing gallium nitride that are produced by known methods and have relatively large bows (e.g., about 50 µm to about 300 µm), the substrates containing gallium nitride produced by methods and systems discussed and described herein will have substantially less bowing and defects (e.g., dislocations, point defects, etc.) as does similar substrates known in the art. For example, the substrates containing gallium nitride produced by methods and systems discussed and described herein can have a bow of less than 50 µm. For example, the substrate or substrate can have no bow at about 0 µm or a bow from greater than 0 µm to less than 1 µm, to less than 5 µm, to less than 10 µm, to less than 20 µm, to less than 30 µm, to less than 40 µm, to less than 50 µm.

Embodiments discussed and described herein incorporate one or more of the following methods and/or systems for depositing gallium nitride.

Figure 1:
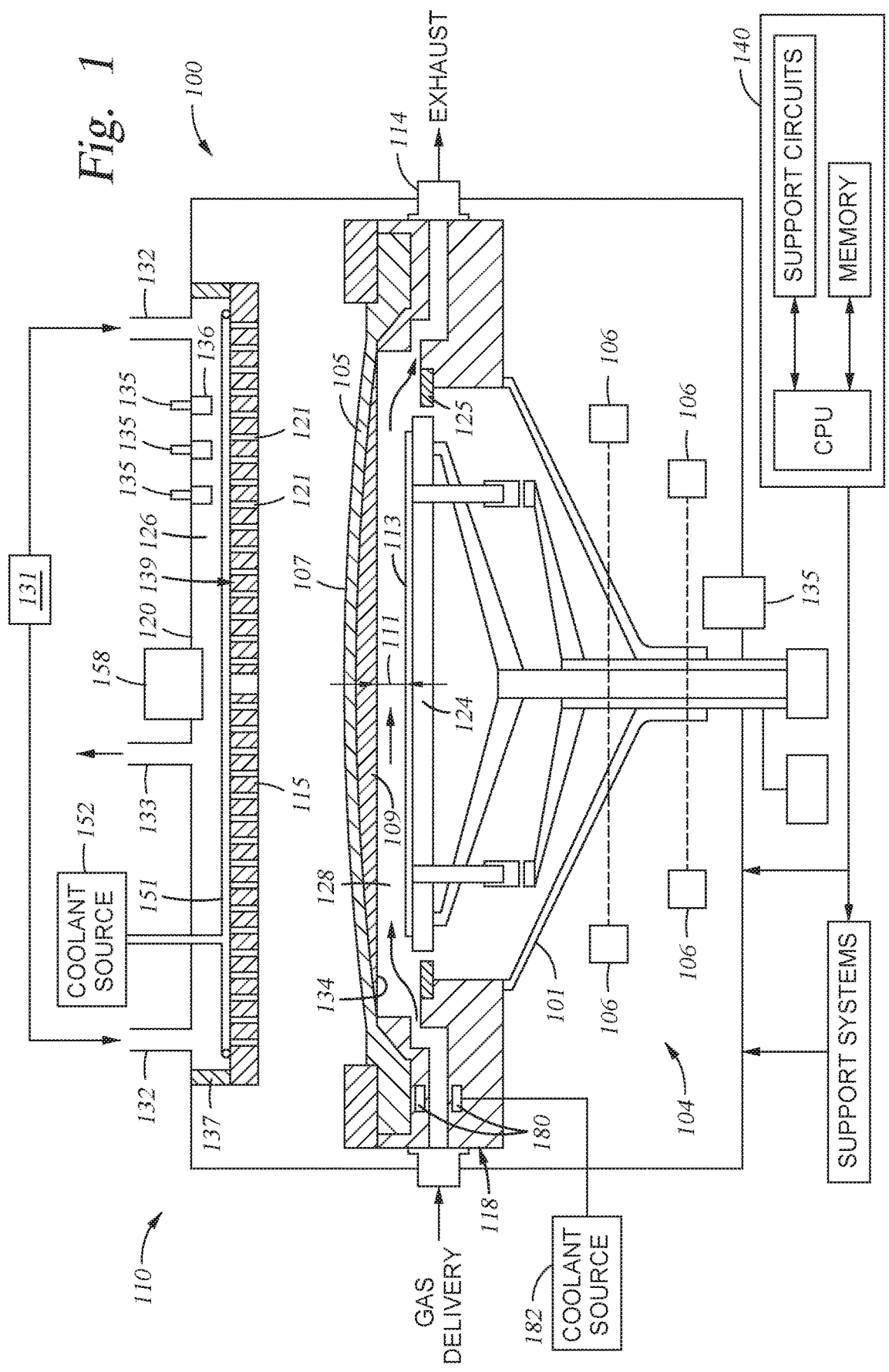
FIG. 1 is a schematic sectional view of a deposition system.

FIG. 1 is a schematic sectional view of a deposition system 100 comprising a chamber 110 with an optically transparent divider 105 (a first or upper optically transparent plate) and a lower optically transparent plate 101 (a second upper optically transparent plate). The optically transparent plate 101 and the optically transparent divider 105 may be in the form of a flat plate or a dome shape having a curved surface as shown. The optically transparent plate 101 and the optically transparent divider 105 is made of an optically transparent material, such as quartz, and is transparent to thermal energy in the form of light and/or wavelengths utilized by optical sensors or measurement devices, such as metrology devices. For example, the optically transparent plate 101 and the optically transparent divider 105 is transparent to light from a plurality of lamps 106 disposed below a susceptor 124. A preheat ring 125 is shown positioned about a periphery of the susceptor 124.

The optically transparent divider 105 also enables a line of sight view of a substrate 113 on the susceptor 124 for various metrology devices, such as temperature measurement devices and other devices adapted to detect/monitor properties of the substrate 113 during processing. The optically transparent divider 105 can be transparent over a wide range of wavelengths and/or can be formed with a coating that will exclude one or more desired wavelengths. The coatings can be used to improve the signal-to-noise ratio of an optical measurement device (e.g., pyrometer), which is positioned over the optically transparent divider 105 to measure the temperature of the substrate 113 or other components in the process chamber.

The optically transparent divider 105 may include an optional transparent insert 109 which is utilized to provide a gap 128 between the substrate 113 and the optically transparent divider 105 that has a constant or equal height 111.

A reflector plate 115 is positioned between a lid plate 120 of the chamber 110 and the optically transparent divider 105. The reflector plate 115 includes a plurality of perforations 121 formed therethough. A portion of the perforations 121 disposed below various metrology devices disposed on a lid plate 120 of the chamber 110 are aligned with a respective metrology device to enable line of sight viewing of the substrate 113 through the reflector plate 115. A pressurized fluid source 131 is in fluid communication with a volume 126 between the optically transparent divider 105 and the lid plate 120 via a plurality of inlet ports 132. The pressurized fluid source 131 includes a gas, such as air, that is flowed against an upper surface 107 of the optically transparent divider 105 through the plurality of perforations 121 of the reflector plate 115. The pressurized fluid impinges the upper surface 107 of the optically transparent divider 105 in order to cool the optically transparent divider 105. The reflector plate 115 is supported by a support ring 137 coupled to the lid plate 120.

The cooling of the optically transparent divider 105 prevents deposition of materials on surfaces of the optically transparent divider 105. The prevention of deposition onto the optically transparent divider 105 maintains transparency thereof and prevents buildup of deposition materials that may flake off in the form of particles. The pressurized fluid exits the volume 126 between the optically transparent divider 105 and the lid plate 120 through one or more exhaust ports 133 (only one is shown in FIG. 1).

Metrology devices disposed on the lid plate 120 of the chamber 110 includes a plurality of temperature probes 135 as well as a substrate orientation probe 156. Each of the temperature probes 135 include pyrometers adapted to provide a metric of temperature of the substrate 113 through the reflector plate 115 and the optically transparent divider 105. At least one temperature probe 135 is provided in the chamber 110 to measure temperature of the susceptor 124 through the optically transparent plate 101. The substrate orientation probe 156 is adapted to provide a metric of substrate bow by viewing the substrate 113 through the reflector plate 115 and the optically transparent divider 105. Each of the temperature probes 135 include a shield 136 coupled thereto and/or to the lid plate 120. The shields 136 are utilized to block reflected light from the respective probe. A length of the shields 136 may be adjusted to extend toward or away from an upper surface 139 of the reflector plate 115 in order to control air flow through perforations 121 that are aligned with the temperature probes 135.

The reflector plate 115 is formed from or coated with a reflective material. In one example, the reflector plate 115 comprises a copper (Cu) body that is coated with a reflective metal, such as gold (Au). The reflector plate 115 also includes a coolant channel 151 that is utilized for flowing a cooling fluid against the upper surface 139 of the reflector plate 115 in order to remove thermal energy therefrom. The coolant channel 151 is in fluid communication with a coolant source 152, which may be water, ethelyne glycol, a coolant sold under the tradename GALDEN®, or other suitable coolant. According to embodiments described herein, the temperature of the optically transparent divider 105 may be less than about 400 degrees Celsius during processing when the substrate 113 is at a temperature of about 1050 degrees Celsius.

The chamber 110 includes a gas delivery system that is fluid cooled. The gas delivery system includes an injection block 118 that delivers precursors as well as purge gases to the substrate 113 along a flow path designated by arrows in FIG. 1. The flow path for precursors generally resides in the gap 128 formed between the upper surface of the substrate 113 and the optically transparent divider 105. The injection block 118 is also configured to flow a purge gas toward and along a process side 134 of the optically transparent divider 105. Excess precursor gases as well as purge gases are exhausted at exhaust port 114.

The injection block 118 includes a plurality of fluidly isolated precursor delivery channels, which prevent premature mixing of supplied precursor gases, and a plurality of cooling fluid channels 180. Each of the cooling fluid channels 180 are fluidly coupled to a coolant source 182. The coolant source 182 supplies water, ethelyne glycol, a coolant sold under the tradename GALDEN®, or other suitable coolant, to the cooling fluid channels 180. The cooling fluid channels 180 are utilized to maintain a temperature in the injection block 118 that is below a decomposition temperature of the precursor gases. The cooling fluid channels 180 also maintain a temperature of portions of structures that are a part of and//or adjacent to the injection block 118 such that precursor gases do not decompose before entering the flow path above the substrate 113. The deposition system 100 is coupled to a controller 140 which includes a central processing unit (CPU), support circuits, a memory as well as support systems.

In one example, gallium nitride (GaN) deposition and by-products of trimethyl gallium (TMGa) is harmful to quartz surfaces. In some instances, decomposed TMGa devitrifies quartz materials which may convert transparent quartz (such as the optically transparent divider 105) into opaque quartz and/or creates particles. In addition, decomposition of TMGa within the injection block 118 may clog flow channels within the injection block 118 as well as deposit GaN on surfaces of the injection block 118. In one embodiment, the fluid channels 180 maintain a temperature in the injection block 118, as well as a temperature of components adjacent thereto, at less than about 350 degrees Celsius, thereby preventing decomposition of TMGa prior to entering the flow path.

Figure 2:
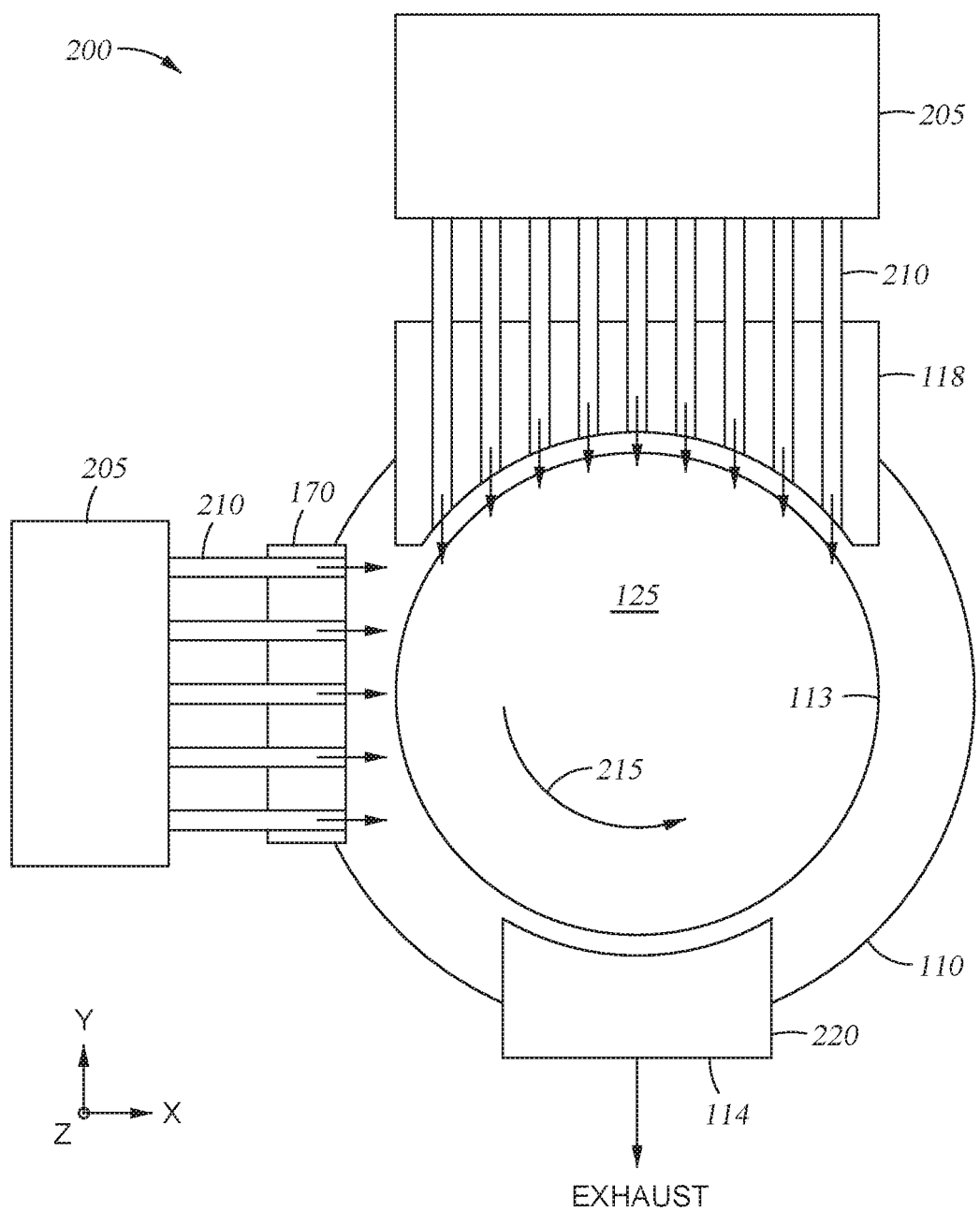
FIG. 2 is a schematic top plan view one embodiment of a gas delivery system for the chamber of FIG. 1.

FIG. 2 is a schematic top plan view one embodiment of a gas delivery system 200 that can be used to grow or deposit gallium nitride, other Group III/V materials, and other materials for one or more slip, intermediate, and/or buffer layers, as discussed and described in one or more embodiments herein. The gas delivery system 200 may be utilized in the chamber 110 of FIG. 1. The gas delivery system 200 includes a gas source 205 that supplies multiple gases to the injection block 118 (a first injection block) and/or a second injection block 170. The first injection block 118 flows process gases across the substrate 113 in a first direction (the Y direction) and the second injection block 170 flows process gases across the substrate 113 in a second direction orthogonal to the first direction (the X direction). The gas source 205 includes process gases including TMGa, ammonia ($NH_3$), or other process or precursor gases as described herein. The gas source 205 also includes purge gases that include nitrogen-containing gases and/or hydrogen containing gases, for example $N_2$ or $H_2$, or $N_2$ and $H_2$. On or both of the injection block 118 and the second injection block 170 are configured to flow the purge gases toward the optically transparent divider 105 and/or along the flow paths shown in FIG. 1 or 2.

Each of the first injection block 118 and the second injection block 170 include a plurality of gas injection ports 210 that flows process gases across the substrate 113. During processing, the substrate 113 may be rotated in the direction of arrow 215. Unused gases as well as byproducts are removed from the chamber 110 by an exhaust port 220.

Figure 3:
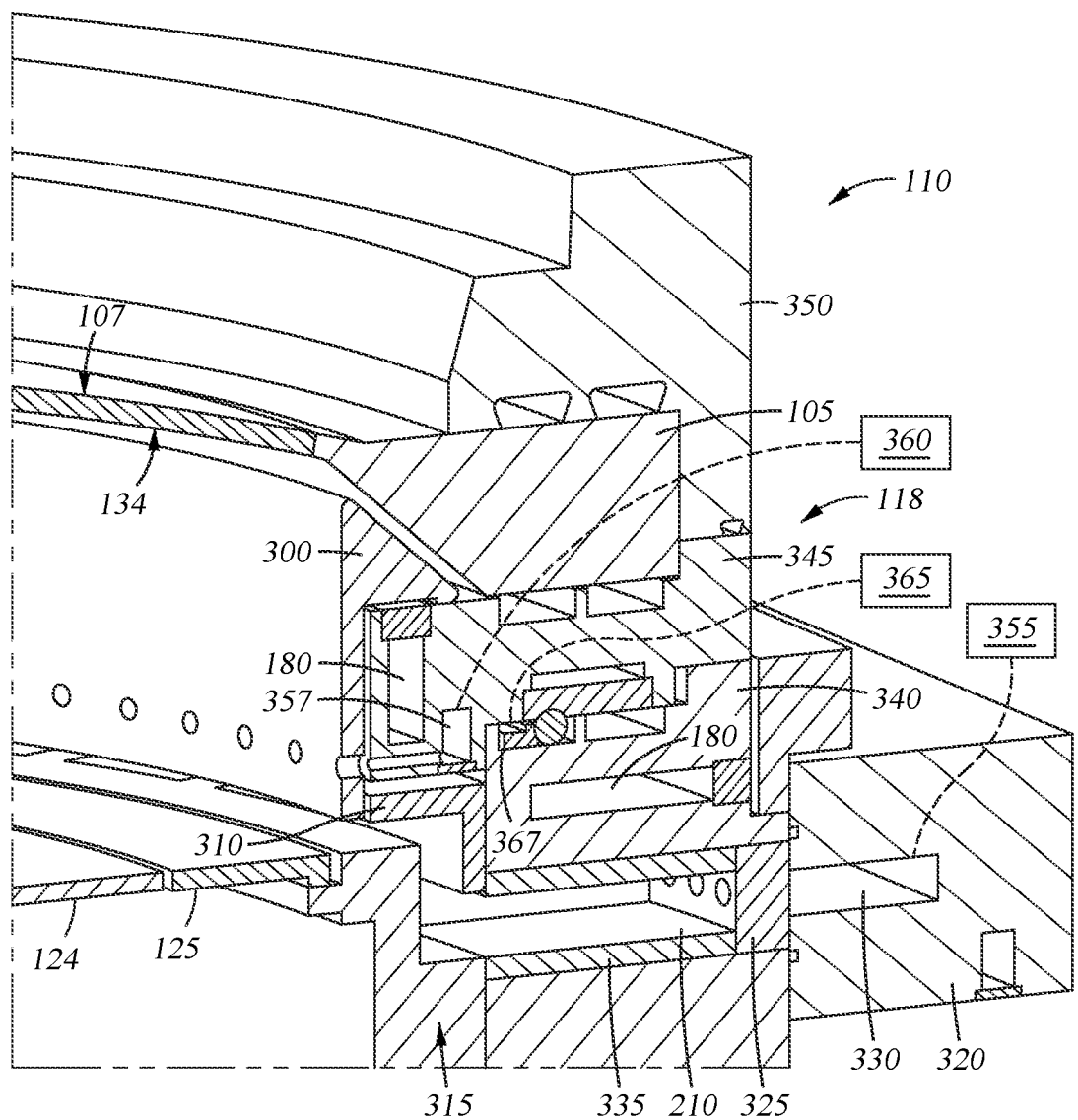
FIG. 3 is a schematic sectional view of a portion of the chamber showing components of the first injection block.

FIG. 3 is a schematic sectional view of a portion of the chamber 110 showing components of the first injection block 118. The fluid channels 180 are shown adjacent to various flow channels described below.

The first injection block 118 includes a plurality of liners, such as an injector plate liner 300, an upper process gas liner 310 and a lower process gas liner 315. The first injection block 118 also includes an inject cap 320 and an inject baffle plate 325 coupling a gas injection port 210 to a first gas channel 330. The gas injection ports 210 (only one is shown) are lined by injection inserts 335. The first injection block 118 also includes a baseplate ring 340 and an injector plate 345. The components of the first injection block 118 are secured by a clamp ring 350.

Exemplary materials associated with the components of the first injection block 118 are metals and dielectric materials, such as quartz. The inject cap 320, the baseplate ring 340, the injector plate 345 and the clamp ring 350 may be made of a metallic material, such as stainless steel, in some embodiments. The lower process gas liner 315 may be made from opaque quartz. The injector plate liner 300, the upper process gas liner 310, the inject baffle plate 325 and the injection inserts 335 are made of a quartz material.

The first injection block 118 is coupled to a plurality of gas sources as part of the gas delivery system 200. A first gas source 355 is coupled to the first gas channel 330. A second gas source 360 is coupled to a second gas channel 357. A third gas source 365 is coupled to a third gas channel 367 formed in the baseplate ring 340.

Figure 4:
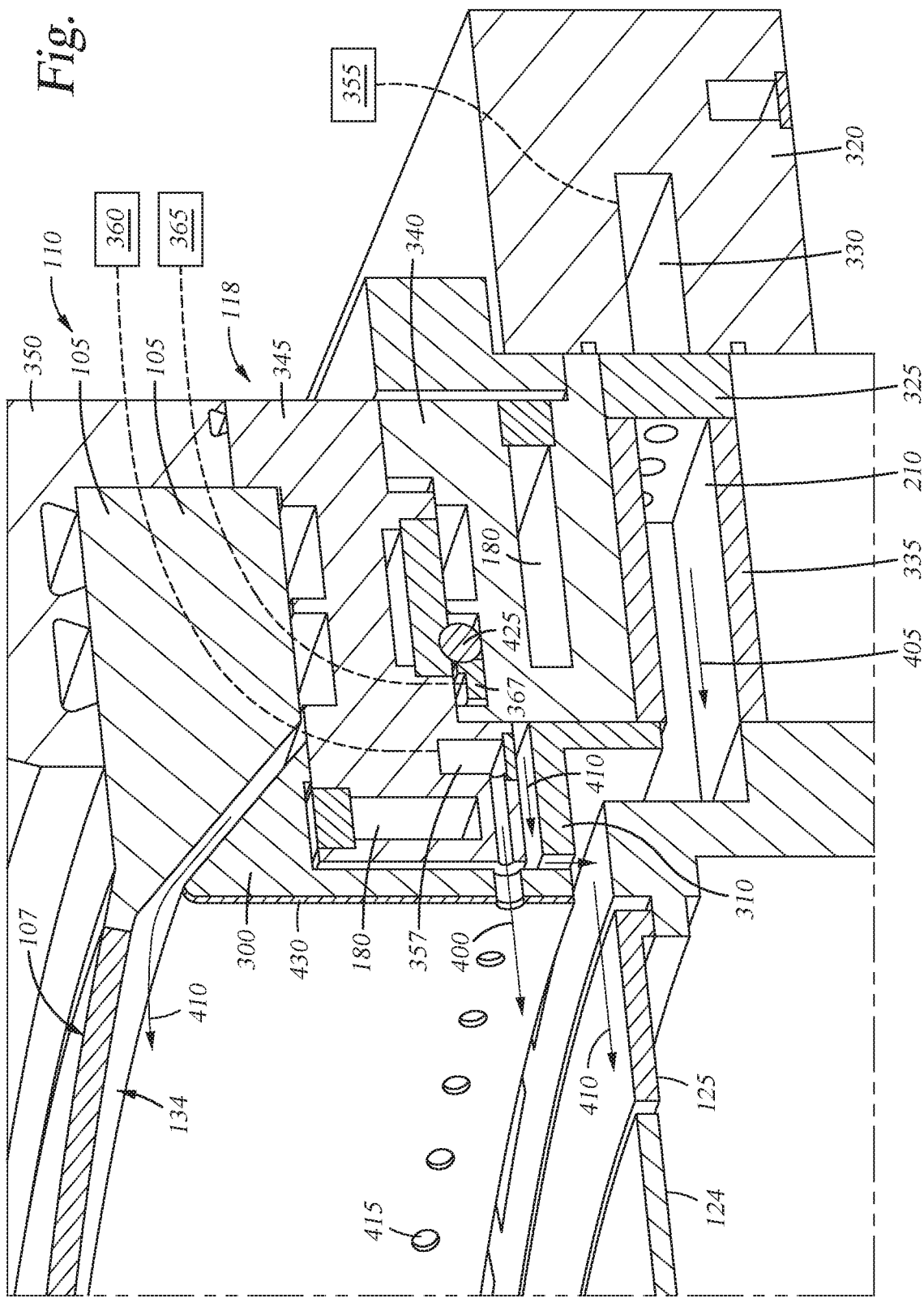
FIG. 4 is a schematic sectional view of a portion of the chamber showing flow paths for a precursor gas, a flow path for a processing gas, and flow paths for a purge gas through the injection block.

FIG. 4 is a schematic sectional view of a portion of the chamber 110 showing flow paths for a precursor gas 400 (e.g., TMGa), a flow path for a processing gas 405 (e.g., $NH_3$, $N_2$ or $H_2$) and flow paths for a purge gas 410 through the injection block 118. Also shown in FIG. 4 is a third fluid channel 180 formed in the baseplate ring 340. A seal 425, such as an O-ring, separates the fluid channel 180 from the third gas channel 367. The flow path for the purge gas 410 also prevents premixing of the processing gases with the precursor gases.

The second gas channel 357 is located adjacent to the injector plate 345. The injector plate 345 is located adjacent to the fluid channels 180. A cooling fluid, such as a gas or water, is flowed in the fluid channels 180 during processing. The cooling fluid flowing in the fluid channels 180 maintains the temperature of the precursor gas at or below a temperature where the precursor gas dissociates, such as about 350 degrees Celsius. The cooling of the precursor gas by the fluid channels 180 thus prevents deposition onto portions of the first injection block 118. For example, the cooling of the precursor gas by the fluid channels 180 prevents clogging of openings 415 in the injector plate 345. The flow paths for the purge gas 410 also prevent condensation of the precursor gas if the precursor gas is too cold. The flow paths for a purge gas 410 also prevent deposition on the process side 134 of the optically transparent divider 105.

In certain embodiments, surfaces of the injection block 118 may be coated or lined with another material. For example, a surface of the injector plate liner 300 facing the process volume (the preheat ring and susceptor) may be lined or coated with a liner cover 430. The liner cover 430 may be made of quartz, a ceramic coated graphite (such as silicon carbide coated graphite), or a combination thereof. While a ceramic coated graphite liner may elevate temperatures of the injector plate liner 300 which may lead to more parasitic deposition thereon, the ceramic coating is easier to clean.

Figure 5A:
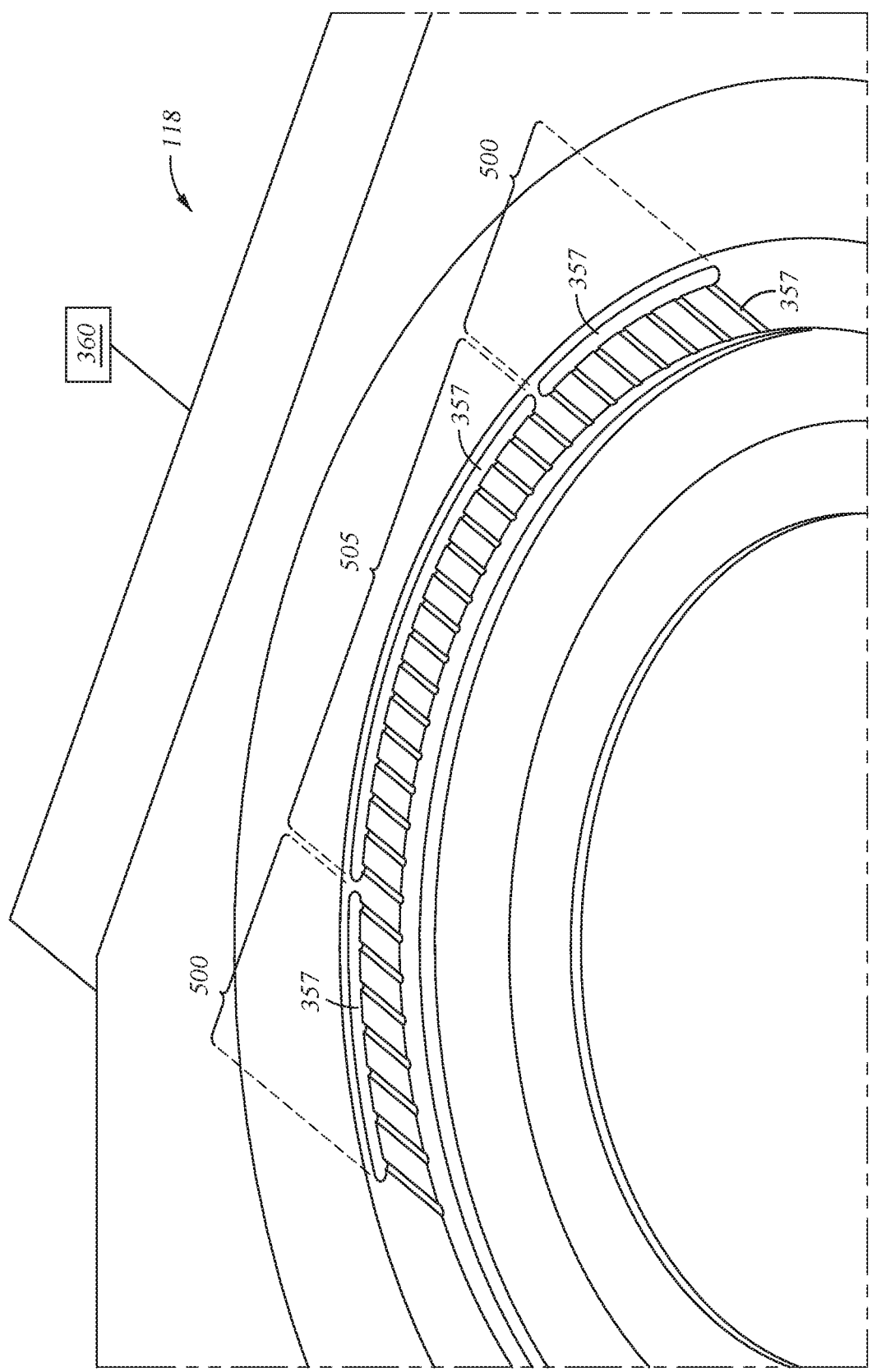
FIGS. 5A and 5B are isometric views of a portion of the first injection block showing inner and outer zones for injecting one or more gases, respectively.
Figure 5B:
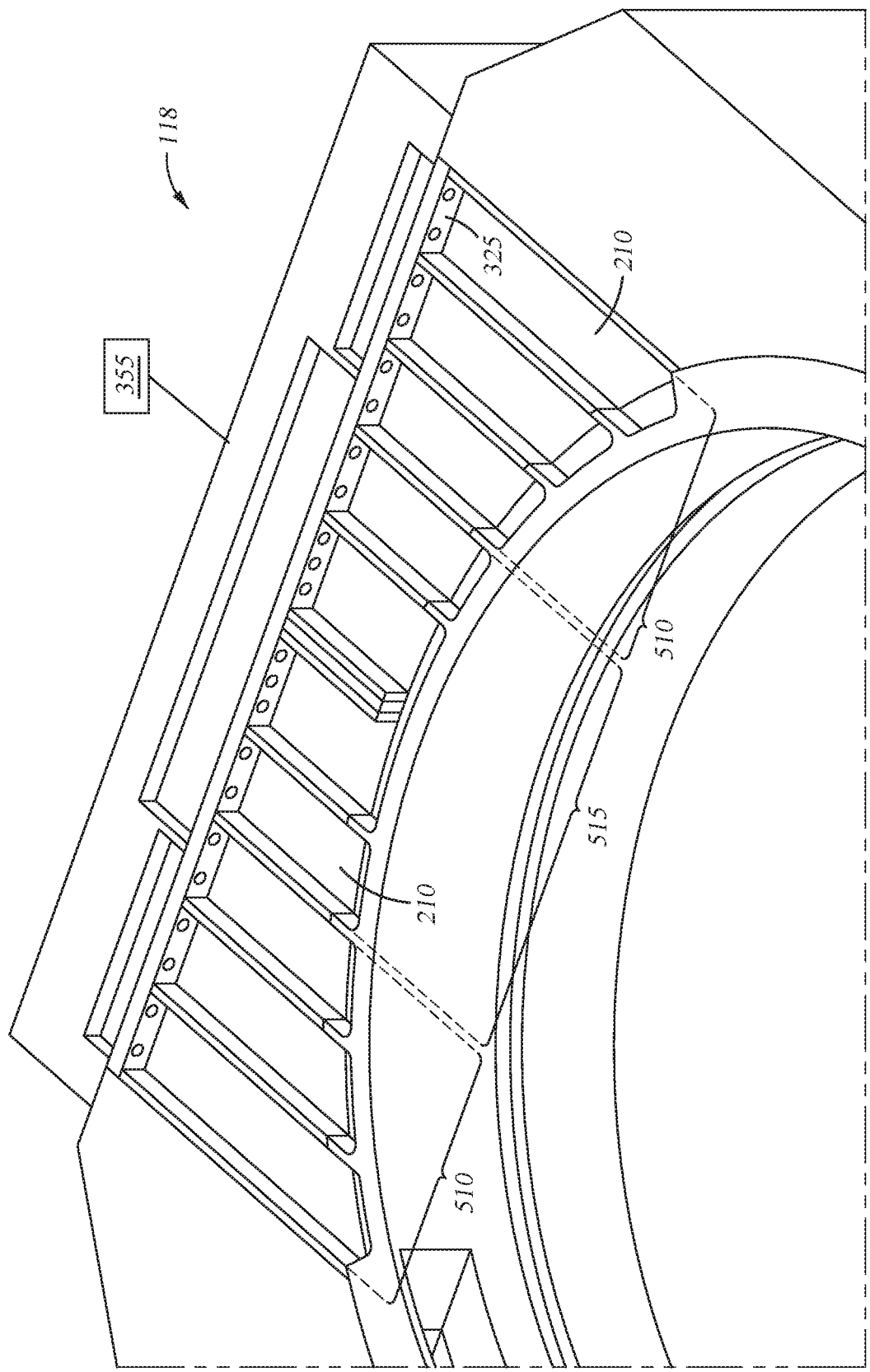

FIGS. 5A and 5B are isometric views of a portion of the first injection block 118. FIG. 5A shows outer injection zones 500 and an inner injection zone 505 for injecting one or more precursor gases. FIG. 5B shows outer injection zones 510 and an inner injection zone 515 for injecting one or more processing gases.

Figure 6:
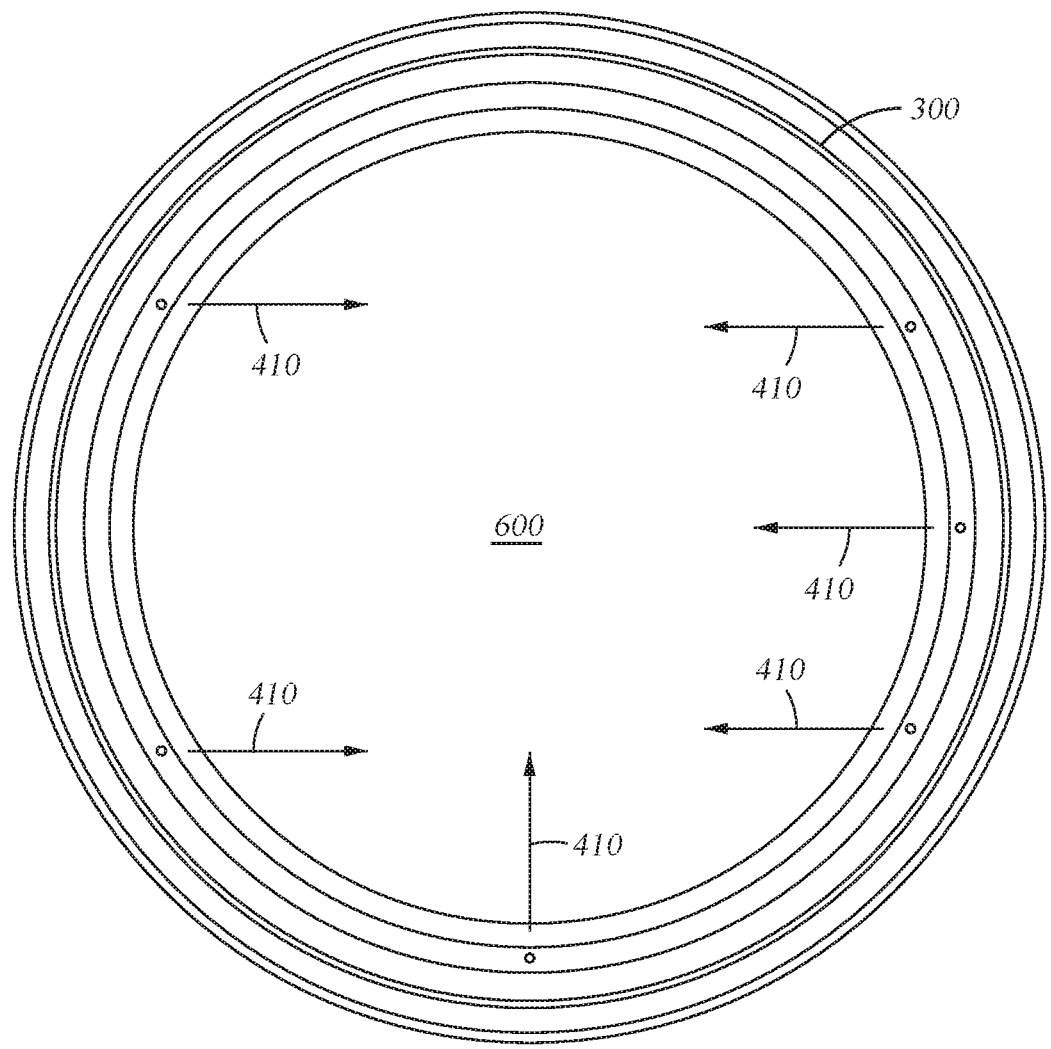
FIG. 6 is a schematic top plan view of the injector plate liner showing various locations flow paths for a purge gas into a processing volume.

FIG. 6 is a schematic top plan view of the injector plate liner 300 showing various locations flows paths for a purge gas 410 into a processing volume 700.

Figure 7A:
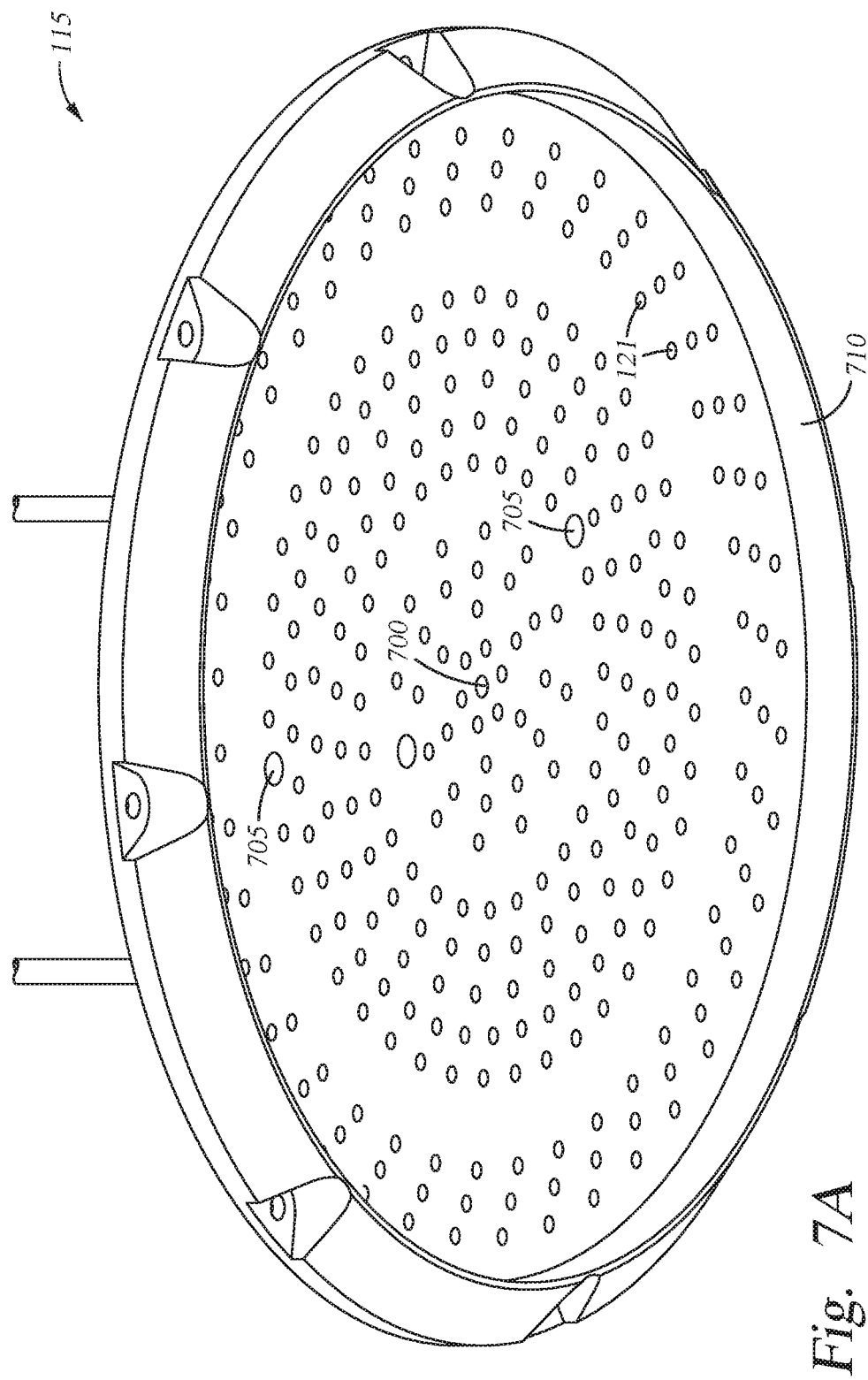
Figure 7B:
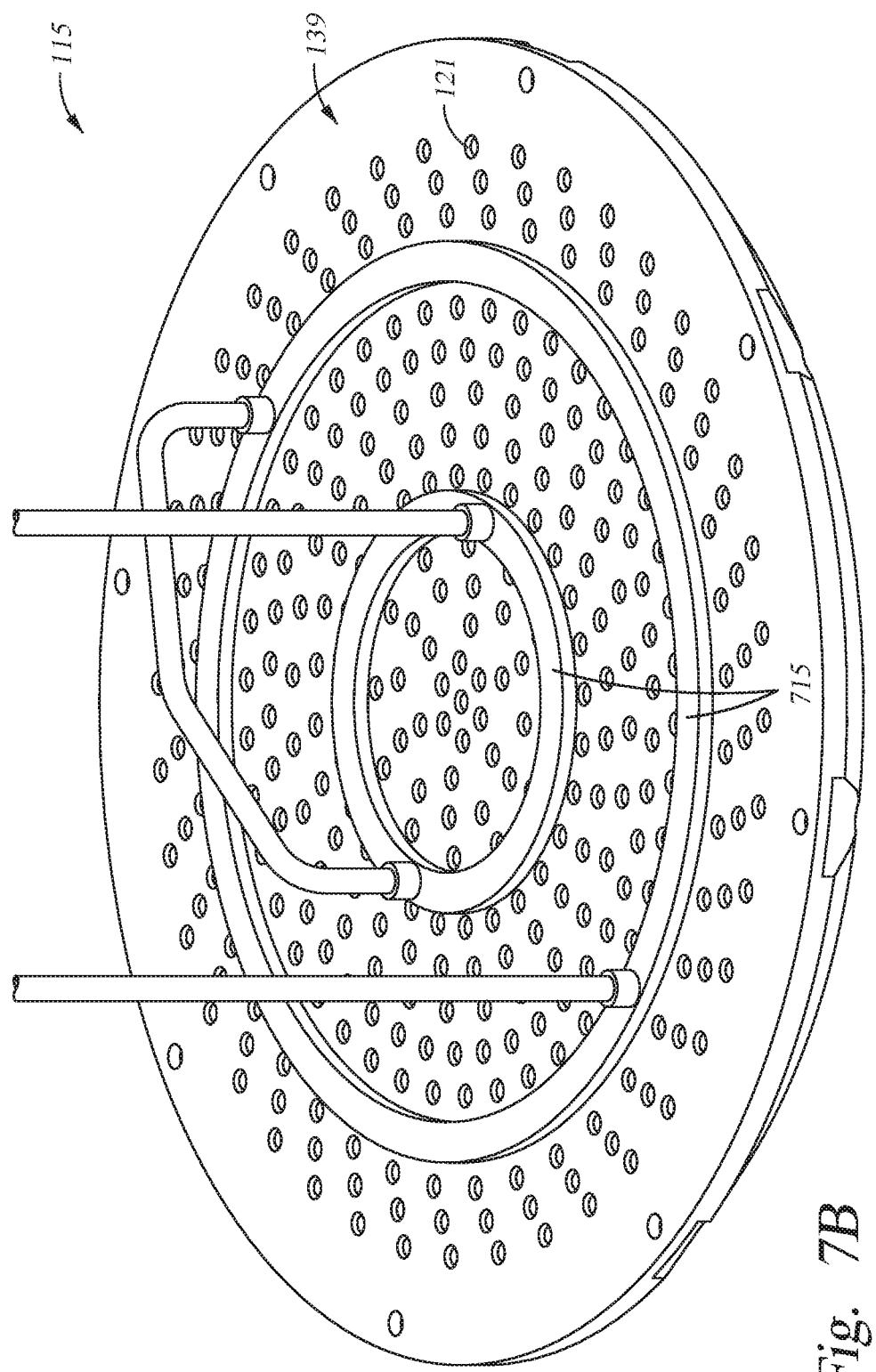

FIGS. 7A-7C are various views of one embodiment of the reflector plate 115 that may be used with the chamber 110 of FIG. 1. The perforations 121 are shown in FIGS. 7A-7C and the coolant channel 151 is shown clearly in FIG. 7C. In FIG. 7A, a central perforation 700 is shown that aligns with the substrate orientation probe 156 of FIG. 1, and enlarged perforations 705 are shown that are aligned with the temperature probes 135 of FIG. 1. The reflector plate 115 also includes a downwardly extending wall that is a peripheral reflector 710. The peripheral reflector 710 reflects thermal energy inward and/or back from the lamps 106 (shown in FIG. 1) toward the substrate 113 (also shown in FIG. 1). One or both of the reflector plate 115 and the peripheral reflector 710 may be angled to direct more energy toward specific portions of the substrate 113. In one example, the peripheral reflector 710 is angled to direct more thermal energy towards the edge of the substrate 113 as compared to thermal energy directed to the center of the substrate 113. As shown in FIGS. 7B and 7C, a cover plate 715 bounds one side of the coolant channel 151.

In one embodiment, the perforations 121 comprise about a 13% open area in the reflector plate 115. In some embodiments, the perforations 121 are sized to provide a velocity of about 100 feet per second (e.g., about 68 miles per hour) of fluid flow through the reflector plate 115.

Figure 8A:
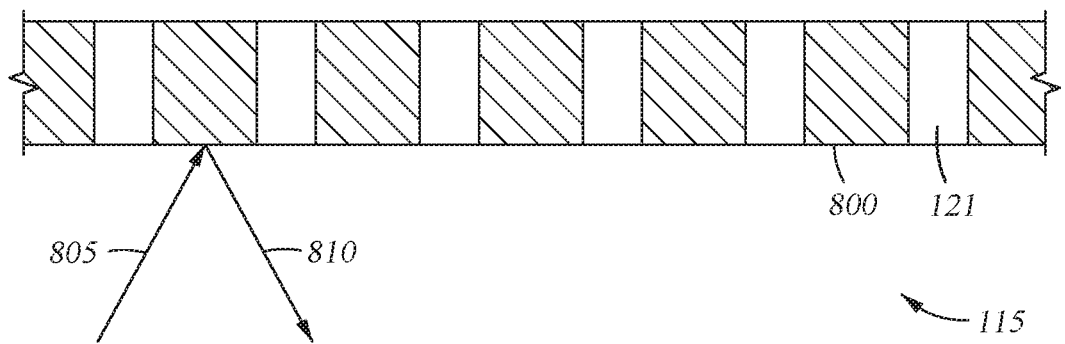
FIGS. 8A-8C are schematic sectional views of portions of the reflector plate of FIG. 1 showing various embodiments of perforations.
Figure 8B:
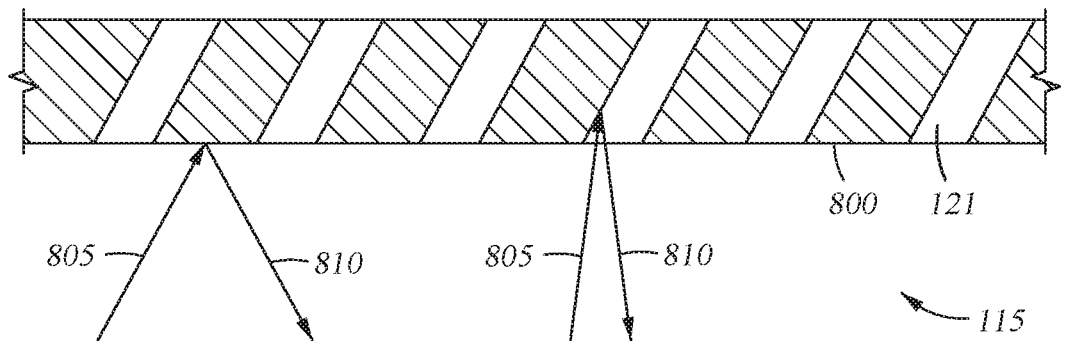
Figure 8C:
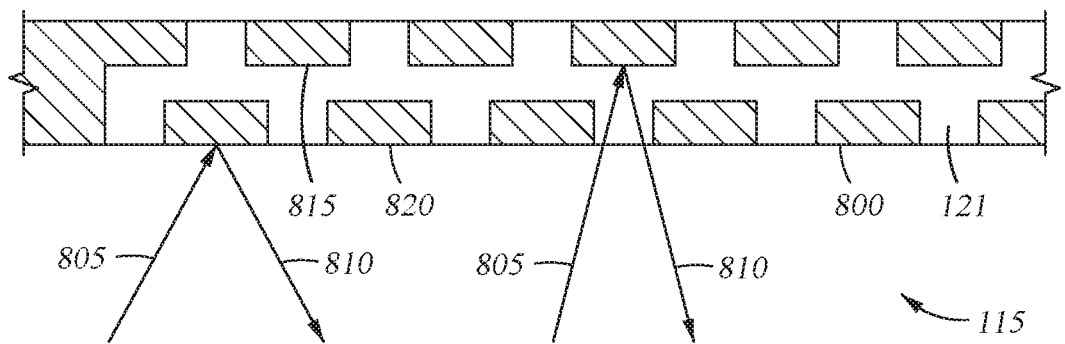

FIGS. 8A-8C are schematic sectional views of portions of the reflector plate 115 showing various embodiments of perforations 121. The perforations 121 shown in FIGS. 8B-8C may be utilized on portions of the reflector plate 115 other than where the metrology devices are located. For example, perforations for the metrology devices may be angled at about a 90 degree angle relative to a plane of a lower surface 800 of the reflector plate 115 such as those shown in FIG. 8A. In another example, all of the perforations 121 may be formed at a 90 degree angle relative to the lower surface 800 of the reflector plate 115 across the reflector plate 115. In other examples, at least a portion of the perforations 121 are angled at a non-normal angle relative to the lower surface 800 of the reflector plate 115 as shown in FIG. 8B. In yet another example, the reflector plate 115 includes a bi-level output face such that a first surface 815 and a second surface 820 surround or bound the perforations 121.

In the embodiment of FIG. 8A light or heat (e.g., energy 905) from the lamps 106 and/or the substrate 113 (both shown in FIG. 1) impinges the surface 800 of the reflector plate 115. Some of the energy 805 is reflected back toward the substrate 113 as reflected energy 810.

In the embodiment of FIG. 8B, energy 805 from the lamps 106 and/or the substrate 113 (both shown in FIG. 1) impinges the surface 800 of the reflector plate 115. Some of the energy 805 is reflected back toward the substrate 113 as reflected energy 810. However, some of the energy 805 enters the perforations 121 and is reflected by surfaces of the perforation 121 toward the substrate 113 as reflected energy 810.

In the embodiment of FIG. 8B, energy 805 from the lamps 106 and/or the substrate 113 (both shown in FIG. 1) impinges a first surface 815 and/or a second surface 820 of the reflector plate 115. Some of the energy 805 is reflected back toward the substrate 113 as reflected energy 810.

While not shown, the second injection block 170 (shown in FIG. 2) may be constructed similarly to the injection block 118 shown in FIGS. 5-8 to have the flow paths and coolant channels as described herein.

Embodiments of the disclosure include methods and apparatus of depositing gallium nitride on a non-gallium nitride containing substrate, comprising depositing a gallium nitride layer on a deposition surface of a substrate, wherein the substrate has a lattice constant that is different from the deposited gallium nitride layer, and the deposition process comprises at least one of the following process steps forming the gallium nitride layer by delivering a first gas flow in a first direction that is substantially tangential to the deposition surface of the substrate, heating the substrate during the deposition process such that the temperature uniformity across the substrate is non-radially uniform, delivering radiant energy to the surface of the substrate using a plurality of radiant lamps while delivering the first gas flow in the first direction that is substantially tangential to the deposition surface of the substrate and delivering a second gas flow in a second direction that is substantially tangential to the deposition surface of the substrate, wherein the second direction is at an angle to the first direction, and detecting a bow in the substrate or a quantity of defects in the deposited gallium nitride layer and adjusting one or more of the process parameters used to deposit the gallium nitride layer based on the detected bow in the substrate or the quantity of defects.

In some examples, the deposition temperature can be in a range from about 400 degrees Celsius to about 1,200 degrees Celsius. Pressure can be less than about 500 Torr in some examples. In other examples, the deposition pressure can be in a range from about 10 Torr or about 20 Torr to about 300, 400, or 500 Torr. Alternatively, a nucleation step pressure is greater than about atmospheric pressure. In some examples, the gas flow can be in a range from about 1 sccm to about 200 slm, or from about 1 slm to about 100 slm.

In one or more aspects, the method can include the generation of a deliberate annular or radial temperature profile during deposition of a III-V film, annealing and/or when cooling down the substrate to control substrate bow and compensate for CTE mismatch between the substrate and deposited layer. Deliberate use of an annular or radial temperature profile during the cooling down process can impress opposite forces to the natural substrate bow in order to reduce or eliminate the substrate bowing. Lamps, zone heating in the substrate support or other sources can be used to provide the radial temperature profile.

Features (e.g., bumps, facets, rings, etc.) formed on the substrate supporting surface can be used to control the heat gain or loss at different regions of the substrate during processing or cooling down.

In one or more embodiments, one or more slip, intermediate, and/or buffer layers can be used to reduce or eliminate substrate bowing. One or more slip, intermediate, and/or buffer layers can be grown or deposited on the front of the substrate (e.g., a silicon substrate), and then grow or deposit single crystal silicon seed on top of the one or more slip, intermediate, and/or buffer layers. The buffer layer and GaN are grown epitaxially on the seed layer. In some examples, the slip layer is like a soft compliant heatsink, or a thin layer that either shear deforms or undergoes controlled facture that does not disturb the upper layers.

In one or more embodiments, a gallium nitride layer is grown or deposited on one or more slip, intermediate, and/or buffer layers disposed on the substrate. In one or more examples, the slip, intermediate, and/or buffer layer can be grown or deposited in multiple steps and/or contain multiple sub-layers. For example, the slip, intermediate, and/or buffer layer can include two or more sub-layers of the same or different materials/compositions. Each of the sub-layer can be grown, then the growth process is stopped, then the sub-layer is annealed, then the growth process is started again to form another sub-layer, then the growth process is stopped, then the sub-layer is annealed. This cycle of growing and annealing can be repeated multiple times, such as 2 to 5, to about 10, to about 15, to about 20, to about 50 times, or more.

While the foregoing is directed to embodiments of the present disclosure, other and further embodiments of the disclosure may be devised without departing from the basic scope thereof, and the scope thereof is determined by the claims that follow.

What is claimed is:

1. A liner assembly, comprising:
   an injector plate liner;
   a gas injector liner coupled to the injector plate liner;
   an upper process gas liner coupled to the gas injector liner;
   a lower process gas liner coupled to the upper process gas liner; and
   an injector plate positioned between the injector plate liner and the upper process gas liner, wherein a cooling fluid channel is formed in the injector plate adjacent to the gas injector liner, and wherein a plurality of purge gas flow paths are formed in the liner assembly.

2. The liner assembly of claim 1, further comprising a baseplate ring positioned between the injector plate and the lower process gas liner.

3. The liner assembly of claim 2, wherein the cooling fluid channel is a first cooling fluid channel and a second cooling fluid channel is formed in the baseplate ring.

4. The liner assembly of claim 1, further comprising a liner cover positioned over the gas injector liner.

5. The liner assembly of claim 1, further comprising an inject baffle positioned between the upper process gas liner and the lower process gas liner.

6. The liner assembly of claim 5, wherein the inject baffle is in fluid communication with a plurality of gas injection ports.

7. The liner assembly of claim 6, wherein each of the plurality of gas injection ports are lined with a metallic insert.

8. The liner assembly of claim 1, wherein the injector plate liner couples to an optically transparent divider.

9. A process chamber, comprising:
   an optically transparent divider and an optically transparent plate positioned opposite the optically transparent divider; and
   a liner assembly, the liner assembly comprising:
      an injector plate liner;
      a gas injector liner coupled to the injector plate liner;
      an upper process gas liner coupled to the gas injector liner;
      a lower process gas liner coupled to the upper process gas liner; and
      an injector plate positioned between the injector plate liner and the upper process gas liner, wherein a cooling fluid channel is formed in the injector plate adjacent to the gas injector liner.

10. The process chamber of claim 9, wherein the liner assembly further comprises a baseplate ring positioned between the injector plate and the lower process gas liner.

11. The process chamber of claim 10, wherein the cooling fluid channel is a first cooling fluid channel and a second cooling fluid channel is formed in the baseplate ring.

12. The process chamber of claim 9, wherein a plurality of purge gas flow paths are formed in the liner assembly.

13. The process chamber of claim 9, wherein the liner assembly further comprises a liner cover positioned over the gas injector liner.

14. The process chamber of claim 9, wherein the liner assembly further comprises an inject baffle positioned between the upper process gas liner and the lower process gas liner.

15. A method of forming a film on a substrate, the method comprising:
   flowing a precursor gas through a liner assembly comprising an injector plate liner surrounding a substrate;
   cooling the precursor gas prior to the gas exiting the injector plate liner to a temperature of about 350 degrees Celsius;
   flowing a processing gas through the liner assembly and toward the substrate at a position below a flow path of the precursor gas while preventing mixing of the processing gas with the precursor gas while the gases are in the liner assembly; and
   heating the precursor gas to a temperature of about 400 degrees Celsius to about 1,200 degrees Celsius above the substrate.

16. The method of claim 15, wherein the liner assembly includes a cooling fluid channel is formed in an injector plate that is coupled to the injector plate liner.

17. The method of claim 15, wherein the liner assembly is coupled to an optically transparent plate.

18. The method of claim 15, further comprising flowing a purge gas through the liner assembly.

19. The method of claim 18, wherein the liner assembly includes multiple purge gas flow paths.

20. A liner assembly, comprising:
   an injector plate liner;
   a gas injector liner coupled to the injector plate liner;
   an upper process gas liner coupled to the gas injector liner;
   a lower process gas liner coupled to the upper process gas liner;
   a baseplate ring positioned between the injector plate and the lower process gas liner; and
   an injector plate positioned between the injector plate liner and the upper process gas liner, wherein a first cooling fluid channel is formed in the injector plate adjacent to the gas injector liner, and wherein a second cooling fluid channel is formed in the baseplate ring.

* * * * *